United States Patent [19]

Kosugi

[11] Patent Number: 5,276,921
[45] Date of Patent: Jan. 4, 1994

[54] TRANSMITTER WITH NONLINEARITY CORRECTION CIRCUIT

[75] Inventor: Hiroaki Kosugi, Hirakata, Japan

[73] Assignee: Matsushita Electric Industrial Co., Ltd., Osaka, Japan

[21] Appl. No.: 777,012

[22] Filed: Oct. 16, 1991

[30] Foreign Application Priority Data

Oct. 19, 1990 [JP] Japan .................... 2-282120

[51] Int. Cl.[5] .............................. H04B 1/00
[52] U.S. Cl. .................... 455/119; 455/120; 455/126; 307/359; 330/131
[58] Field of Search ............... 455/115, 120, 126, 127, 455/119; 307/264, 359; 330/129, 131

[56] References Cited

U.S. PATENT DOCUMENTS

| 3,900,823 | 8/1975 | Sokal et al. ............... | 330/129 |
| 4,563,775 | 1/1986 | Yokosuka ................. | 455/126 |
| 4,591,800 | 5/1986 | Opas ......................... | 330/86 |
| 4,639,938 | 1/1987 | Kennett ..................... | 455/126 |
| 4,706,262 | 11/1987 | Ohta ........................ | 455/126 |
| 5,121,081 | 6/1992 | Hori .......................... | 455/126 |
| 5,124,665 | 6/1992 | McGann .................... | 455/126 |
| 5,129,098 | 7/1992 | McGirr et al. ............. | 455/127 |
| 5,150,075 | 9/1992 | Hietala et al. ............. | 330/129 |
| 5,172,071 | 12/1992 | Braathen ................... | 455/126 |

FOREIGN PATENT DOCUMENTS

0312261A2 10/1988 European Pat. Off. .
0360178A2 9/1989 European Pat. Off. .
2150378A 11/1983 United Kingdom .
2135556A 2/1984 United Kingdom .

OTHER PUBLICATIONS

Jacob Millman, Microelectronics: Digital and Analog Circuits and Systems, 1979 by McGraw-Hill, Inc., pp. 234–235.
"Adaptive Linearisation Using Pre-Distortion", Michael Faulkner et al., 1990 IEEE, pp. 25–40.

Primary Examiner—Reinhard J. Eisenzopf
Assistant Examiner—Timothy H. Keough
Attorney, Agent, or Firm—Wenderoth, Lind & Ponack

[57] ABSTRACT

A feedback loop is composed in which a part of a transmission signal obtained by amplifying a modulation carrier signal by a power amplifier is taken out by a monitor circuit, and is detected by an envelope detector, and a distortion-free envelope signal delivered from an envelope control signal generator is compared in an error amplifier, and by this error signal a gain control terminal of the power amplifier is controlled. The envelope control signal generator possesses a feedback loop which is controlled by a reference voltage and a sample hold signal to stabilize the mean voltage of a reference envelope signal, and also comprises a multiplier for multiplying Vdetb and a ramping up-down signal to generate a burst-form transmission output.

16 Claims, 9 Drawing Sheets

TRANSMITTER WITH NONLINEARITY CORRECTION CIRCUIT

BACKGROUND OF THE INVENTION

1. Field of the Invention

The present invention relates to a transmitter having a power amplifier for transmitting a modulated carrier signal.

2. Description of the Prior Art

This kind of transmitter is hitherto composed as disclosed in U.S. Pat. No. 4,933,986. In this prior art, the transmission signal sent from the transmitter is received by the same transmitter and demodulated to produce a baseband feedback signal, and this signal is applied to a modulation baseband signal. By controlling in such a feedback loop, distortion of the power amplifier is compensated for. This approach, however, involves several disadvantages. First, the device size is increased because the receiver and demodulator are necessary for producing the baseband feedback signal. Further, gain fluctuations of the receiver and demodulator induce variations of the transmission output, and the complicatedness of this part still worsens the problem.

SUMMARY OF THE INVENTION

It is hence a primary object of the invention to present a transmitter capable of delivering a distortion-free transmission signal, by compensating for the distortion generated in the power amplifier in a feedback loop of simple constitution.

A transmitter of the invention picks up a part of a transmission signal amplified by a power amplifier in a monitor circuit, compares a transmission envelope signal detected by an envelope detector with a distortion-free envelope signal in an error detector, and supplies an obtained error signal to a gain control terminal of the power amplifier, thereby controlling the gain of the power amplifier. In such feedback loop control, a distortion-free transmission output is obtained.

In a preferred constitution, a transmitter of the invention comprises a power amplifier having a gain control terminal for amplifying an input modulation carrier signal to obtain a transmission signal, a transmission monitor circuit for taking out a part of the transmission signal from the power amplifier as a monitor signal, a first detector for detecting an envelope of the monitor signal to obtain a transmission envelope signal, an envelope control signal generator including a second detector for detecting an envelope of the input modulation carrier signal to obtain a reference envelope signal for delivering the reference envelope signal as an envelope control signal, and an error amplifier for comparing the envelope control signal and the transmission envelope signal to generate an error signal and supplying the error signal to the gain control terminal of the power amplifier, thereby controlling the gain of the power amplifier.

More preferably, the first detector and second detector may be identical circuits and arranged to be matched in the characteristics, so that the nonlinearity of the detectors may be canceled.

DESCRIPTION OF THE PREFERRED EMBODIMENTS

Figure 1:
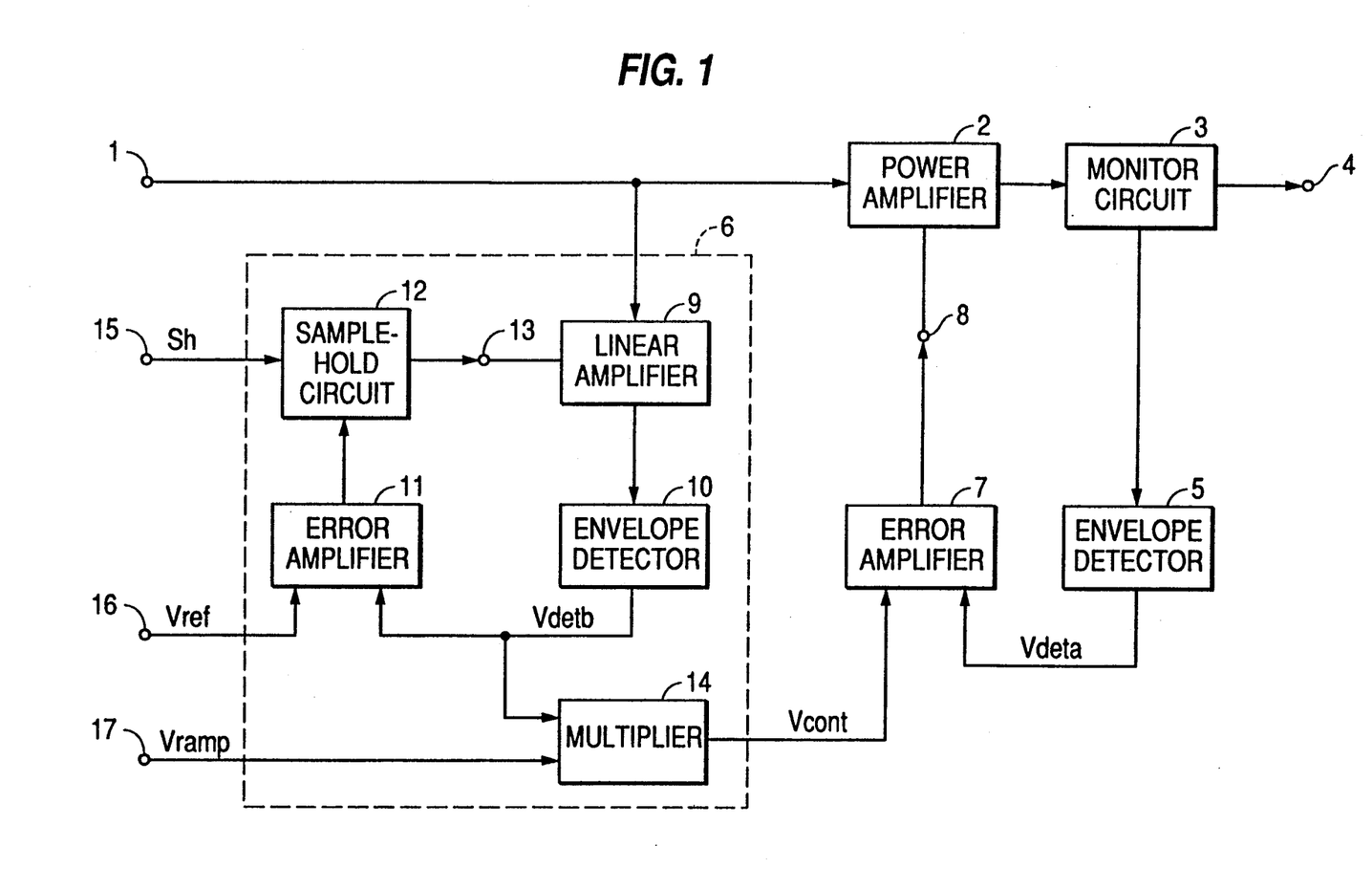
FIG. 1 is a block diagram of a transmitter in accordance with an embodiment of the present invention.
Figure 2:
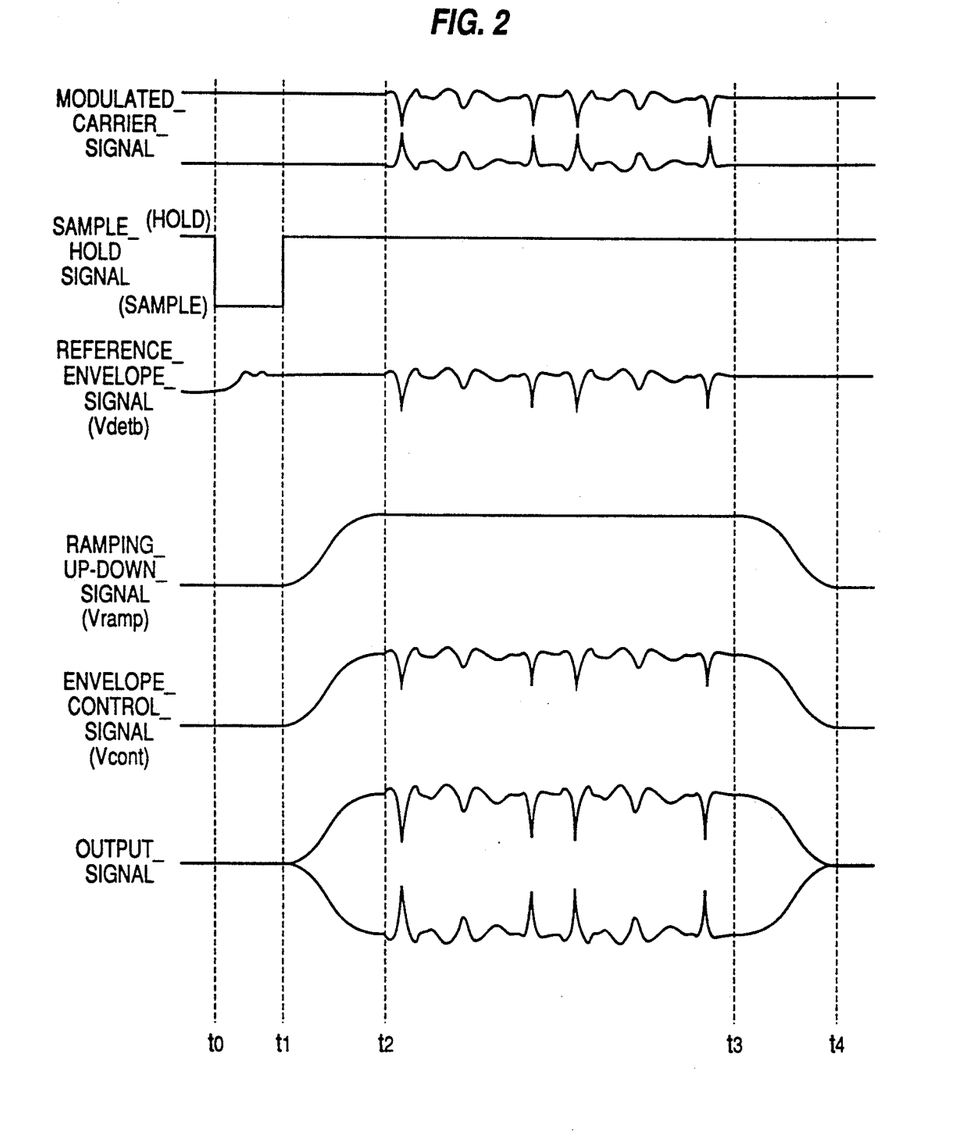
FIG. 2 is a timing chart of the transmitter shown in FIG. 1.

FIG. 1 and FIG. 2 are a block diagram and a timing chart of the transmitter in accordance with an embodiment of the present invention.

In FIG. 1, element 1 is a modulation carrier signal input terminal element 2 is a power amplifier having a gain control terminal 8 for amplifying the modulation carrier signal to obtain a transmission signal element 3 is a monitor circuit for picking up a part of the transmission signal from the power amplifier 2 as a monitor signal element 4 is a transmission signal output terminal element 5 is an envelope detector for detecting the envelope of the monitor signal from the monitor circuit 3 and delivering a transmission envelope signal (Vdeta) element 6 is an envelope control signal generator connected to the modulation carrier signal input terminal 1 for delivering an envelope control signal (Vcont), and element 7 is an error detector connected between the monitor circuit 3 and the envelope control signal generator 6 for comparing the transmission envelope signal (Vdeta) with the envelope control signal (Vcont) to generate an error signal and for supplying the error signal to the gain control terminal 8 to control the gain of the power amplifier 2. The envelope control signal generator 6 comprises a linear amplifier 9 having a gain control terminal 13 for linearly amplifying the modulation carrier signal, an envelope detector 10 for detecting the envelope of the modulation carrier signal amplified by the linear amplifier 9 to obtain a reference envelope signal (Vdetb), an error detector 11 for comparing the reference envelope signal (Vdetb) with a reference voltage (Vref) supplied from a reference voltage input terminal 16 to generate an error signal; a sample and hold circuit 12 connected to the error detector 11 for holding the error signal with a sample and hold signal (Sh) supplied from a sample and hold signal input terminal 15 and for supplying its output to the gain control terminal 13 so as to control the gain of the linear amplifier 9, and a multiplier 14 connected to the detector 10 for multiplying the reference envelope signal (Vdetb) by a ramping up-down signal (Vramp) supplied from a ramping up-down signal input terminal 17. The output of the multiplier 14 is outputted as an envelope control signal (Vcont).

The operation of the transmitter shown in FIG. 1 is explained according to the timing chart in FIG. 2.

In FIG. 2, the period t0-t1 is a period for stabilizing the mean voltage of Vdetb, the period t1-t2 is a transmission signal rise time, the period t2-t3 is a modulation data transmission time, and the period t3-t4 is a transmission signal fall time.

First, the operation in the period t0-t1 is explained. In this period, the modulation carrier signal supplied from the modulation carrier signal input terminal 1 is supposed to be a signal without amplitude variation. The sample and hold signal (Sh) is supposed to be a sample signal. The ramping up-down signal (Vramp) is supposed to be 0 V. The reference voltage (Vref) is supposed to be a DC voltage determined depending on the transmission output power. The linear amplifier 9 and envelope detector 10 in the envelope control signal generator 6, the error amplifier 11 and the sample and hold circuit 12 compose a first feedback loop, and it is controlled so that the voltage of Vdetb may be nearly equal to the voltage of Vref. On the other hand, in the multiplier 14, since Vdetb and Vramp(=0 V) are multiplied, the output is 0 V. The power amplifier 2, monitor circuit 3, envelope detector 5, and error amplifier 7 compose a second feedback loop, and the output transmission signal is controlled by the output Vcont(=0 V) of the envelope control signal generator 6.

At time t1, the sample and hold signal (Sh) becomes a hold signal, and the sample and hold circuit 12 retains the control voltage for controlling the gain control terminal 13, thereby keeping the mean voltage of Vdetb constant thereafter.

Between t1 and t2, (Vramp) rises gradually, and Vcont, or the output of the multiplier 14, rises gradually, so that the transmission signal rises gradually.

Between t2 and t3, the modulation carrier signal is a modulated signal, and a distortion-free envelope signal is delivered from the envelope control signal generator 6. The second feedback loop is controlled by this distortion-free envelope signal, so that a distortion-free transmission signal is generated.

Between t3 and t4, by the reverse sequence to that in t1-t2, the transmission signal falls gradually.

It is demanded here that the power amplifier 2 should be small in phase fluctuation near the saturation point where the motion is nonlinear, which is realized by optimizing the output load impedance of the transistor in the power amplifier 2.

It is also required that the power amplifier 2 should be small in phase fluctuation against changes of the control voltage supplied to the gain control terminal 8. This is known to be realized by controlling the drain voltage or collector voltage of the transistor in the power amplifier 2. It is also realized by using and controlling the second gate of a dual gate MOS-FET in the power amplifier 2.

Figure 3A:
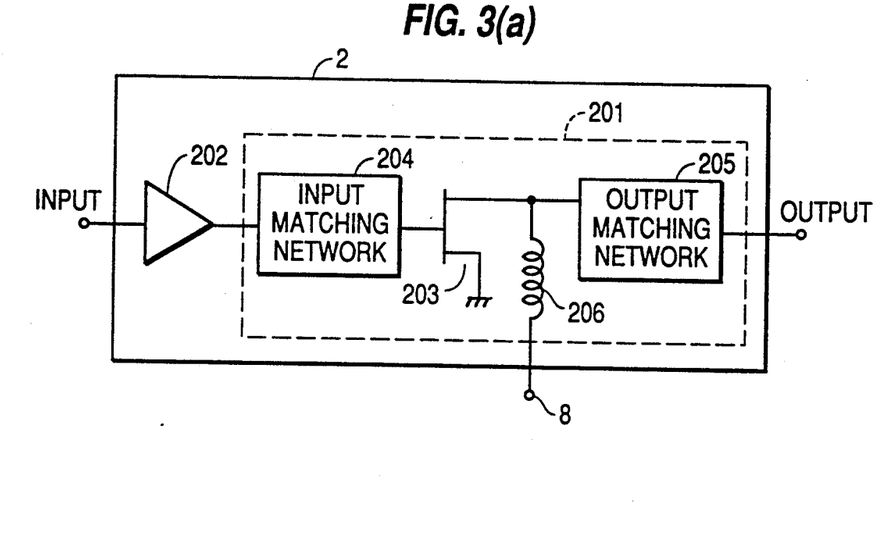
FIG. 3(a) is a block diagram showing an example of a power amplifier.

An example of the power amplifier 2 is shown in FIG. 3(a).

In FIG. 3(a), element 201 is a final stage amplifier; element 202 is a preamplifier; element 203 is a GaAs FET (field-effect transistor) for composing the final stage amplifier 201; elements 204 and 205 are an input matching network and an output matching network of the final stage amplifier 201, and element 206 is a choke coil connected to the drain of the GaAs FET 203. The other end of the choke coil is connected to the gain control terminal 8.

Figure 3B:
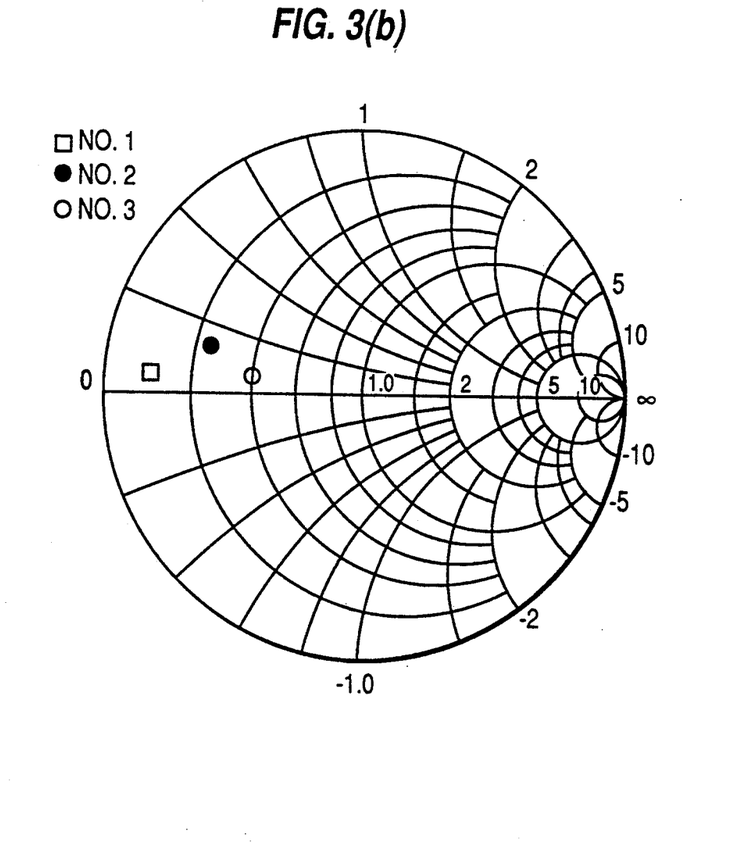
FIGS. 3(b) and 3(c) are characteristic diagrams for explaining the operation of the power amplifier shown in FIG. 3(a).
Figure 3C:
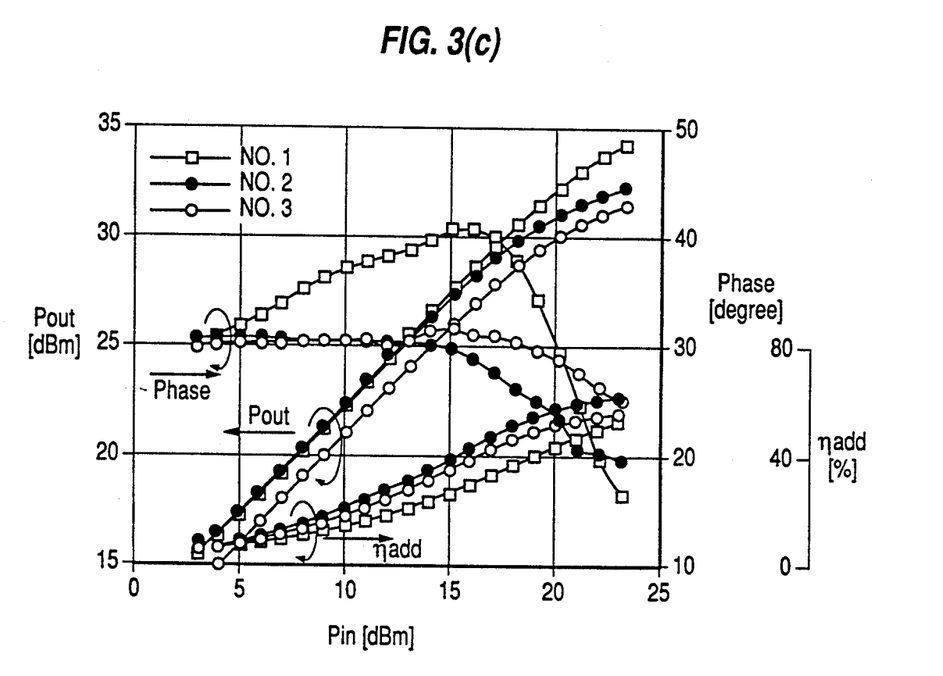

The characteristic of the final stage amplifier 201 varies with the output matching network 205. The characteristic of the final stage amplifier 201 when the impedance of the output matching network 205 as seen from the GaAs FET 203 side is changed as shown in FIG. 3(b) is shown in FIG. 3(c). In FIG. 3(c), Pin denotes an input power, Pout is an output power, $\eta$ add is the addition power efficiency, and Phase is the phase difference between the input and output. When the impedance of the output matching network is No. 1, the transmission output is maximum, and when No. 2, the addition power efficiency is maximum, and when No. 3, the phase change is minimum. By setting the impedance to No. 3, the phase fluctuation may be reduced also in the vicinity of the saturation point. By controlling the drain of the GaAs FET 203 through the choke coil 206 from the gain control terminal 8, the gain is changed by varying the saturated power of the GaAs FET 203. It is the characteristic of the GaAs FET that the phase change is small when controlled at the saturation point, and it is possible to realize the power amplifier 2 small in phase change even against the change of the control voltage supplied to the gain control terminal 8.

Figure 4A:
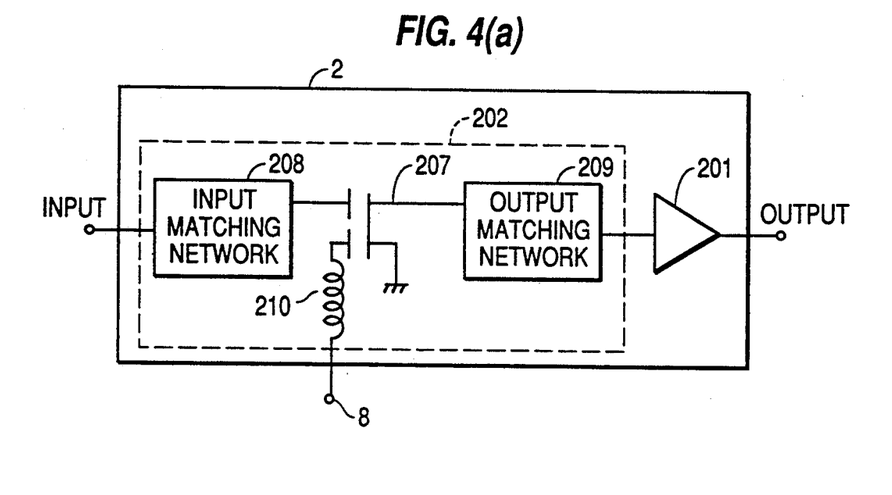
FIG. 4(a) is a block diagram showing another example of a power amplifier.

FIG. 4(a) shows another constitutional example of the power amplifier 2.

In FIG. 4(a), element 201 is a final stage amplifier; element 202 is a preamplifier; element 207 is a dual gate MOS FET for composing the preamplifier 208 and 209 are an input matching network and an output matching network of the preamplifier 202, and element 210 is a choke coil connected to the second gate of the dual gate MOS FET 207. The other end of the choke coil is connected to the gain control terminal 8.

Figure 4B:
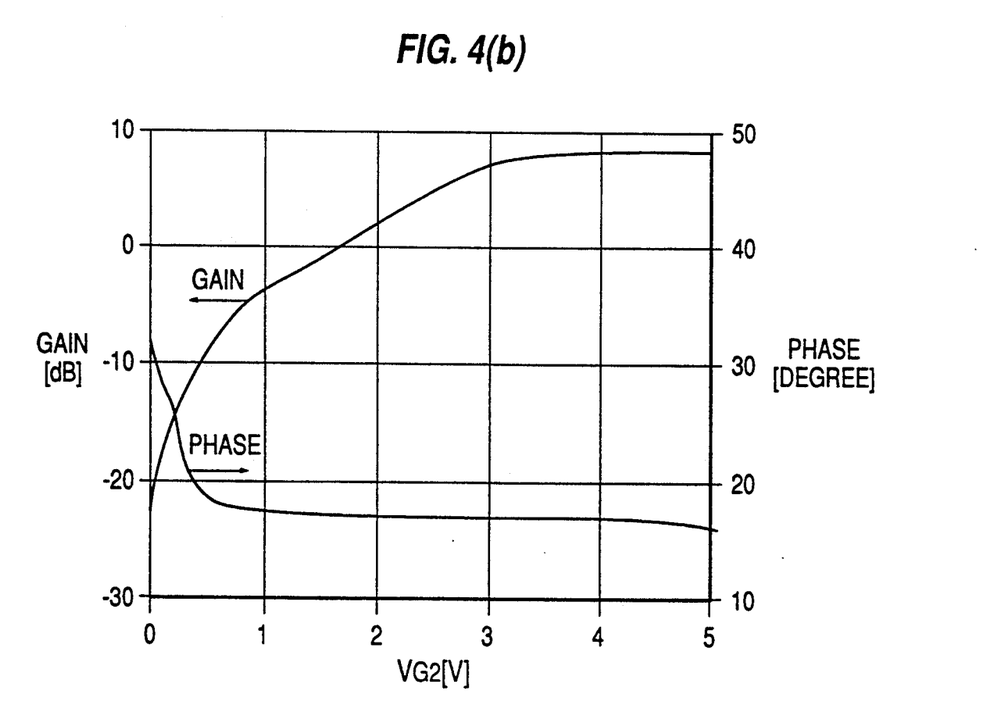
FIG. 4(b) is a characteristic diagram for explaining the operation of the power amplifier shown in FIG. 4(a).

The characteristic of the preamplifier 202 is shown in FIG. 4(b). In FIG. 4(b), VG2 is a voltage supplied to the second gate, Gain is the power gain, and Phase is the phase difference between the input and output. While VG2 is in a range of 1 to 4 V, there is almost no phase fluctuation. That is, by controlling the second gate of the dual MOS FET 207 through the choke coil 210 from the gain control terminal 8 by setting the operation point in a range of 1 to 4 V, the power amplifier 2 of small phase change may be realized.

Figure 5:
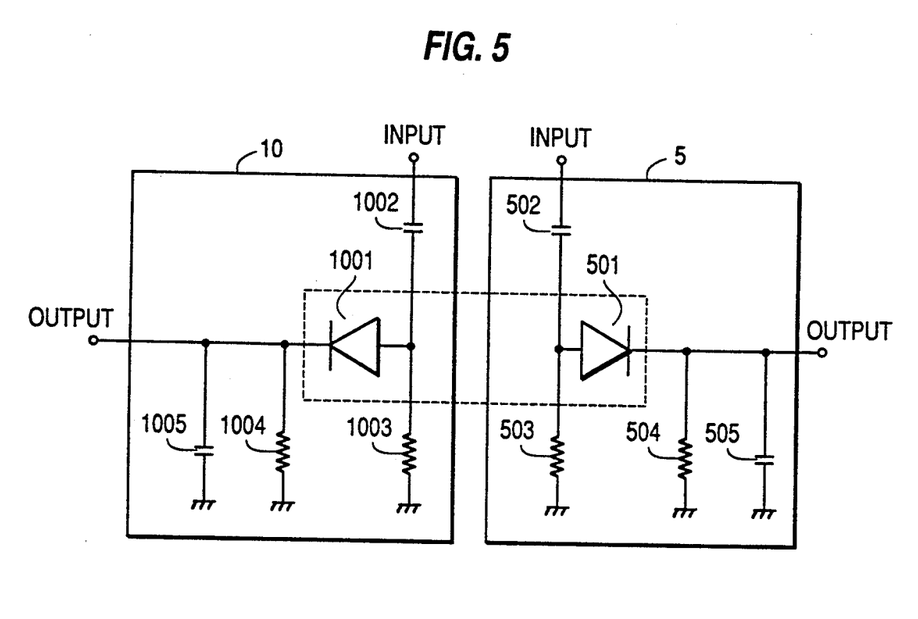
FIG. 5 is a block diagram showing an example of an envelope detector.

FIG. 5 shows an example of the envelope detectors 5 and 10.

In FIG. 5, elements 501 and 1001 are detector diodes; elements 502 and 1002 are capacitors for bypassing the modulation carrier signal; elements 503 and 1003 are bias resistors; elements 504 and 1004 are load resistors, and elements 505 and 1005 are high frequency grounding capacitors. By composing the envelope detector 5 and the envelope detector 10 in identical circuit composition and matching the characteristics of the two, the nonlinearities of the detector diodes 501 and 1001 become identical, and they function so as to compensate for each other. Both characteristics may be matched further by disposing the detector diodes 501 and 1001 on the same semiconductor chip, so that they act to cancel each other even against the changes of characteristics due to temperature.

The multiplier 14 may be composed of an ordinary analog multiplier if Vdatb and Vramp are analog signals. If, however, Vramp is a digital signal, the multiplier 14 may be composed of a D/A converter.

Figure 6:
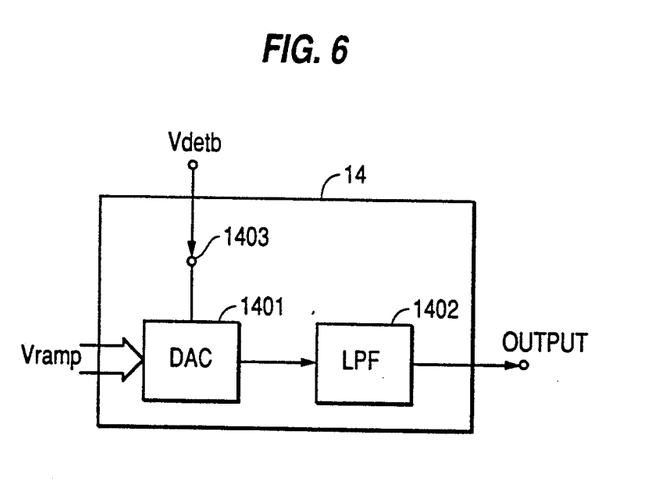
FIG. 6 is a block diagram showing an example of a multiplier.

FIG. 6 is an example of the multiplier 14 using a D/A converter.

In FIG. 6, element 1401 is a D/A converter element 1403 is a reference voltage terminal of the D/A converter 1401, element 1402 is a lowpass filter for removing the sampling clock from the output of the D/A converter 1401.

If the reference voltage terminal 1403 of the D/A converter 1401 is an input terminal of Vdetb and if the D/A converter 1401 is an N-bit D/A converter, when the digital signal Vramp is set at $2^K$, then the output of the D/A converter 1401 will be Vdetb$\times(2^K/2^N)$. Thus, by forming the multiplier 14 with the D/A converter 1401 and LPF 1402 and controlling it with the digital signal Vramp, a signal of high precision not obtained in the analog multiplier may be generated.

In this embodiment, hence, by using the power amplifier 2 of small phase changes and controlling the second feedback loop with the distortion-free envelope control signal which is the output of the envelope control signal generator 6, a distortion-free transmission output may be generated. Furthermore, by composing the envelope detectors 5 and 6 in the same circuit construction to match their characteristics, the distortion generated in the envelope detector may be canceled.

Besides, the signal Vdetb controls the first feedback loop by Vref between t0 and t1 in order to stabilize the mean voltage, so that the output level of the transmission signal is stabilized.

Moreover, by multiplying Vdetb and Vramp by the multiplier 14, a burst transmission signal smooth in rise and fall is realized, and unnecessary spread of the signal in the frequency region due to rise or fall characteristics of the burst transmission signal is reduced.

Figure 7:
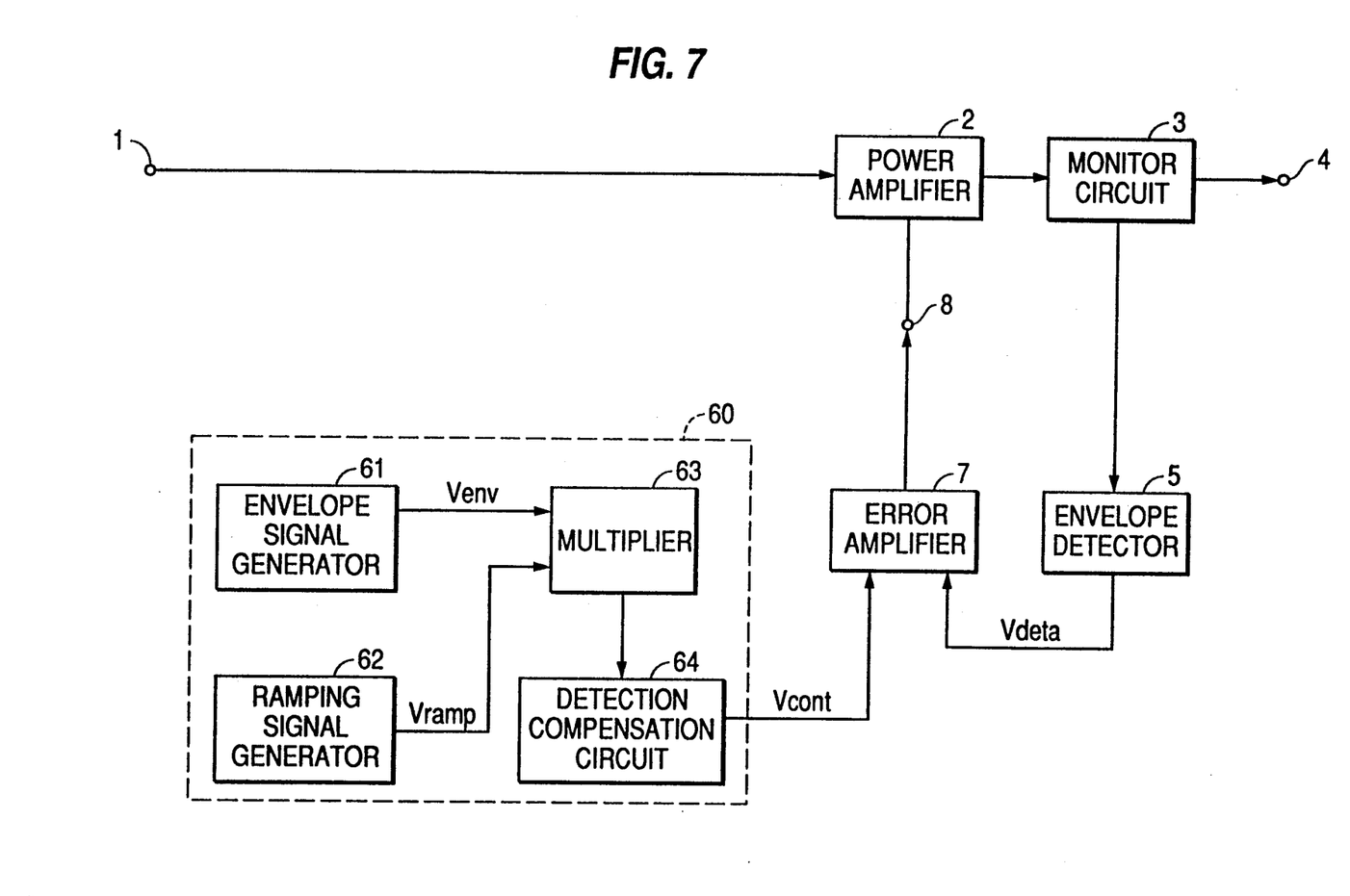
FIG. 7 is a block diagram of a transmitter in accordance with another embodiment of the present invention.
Figure 8:
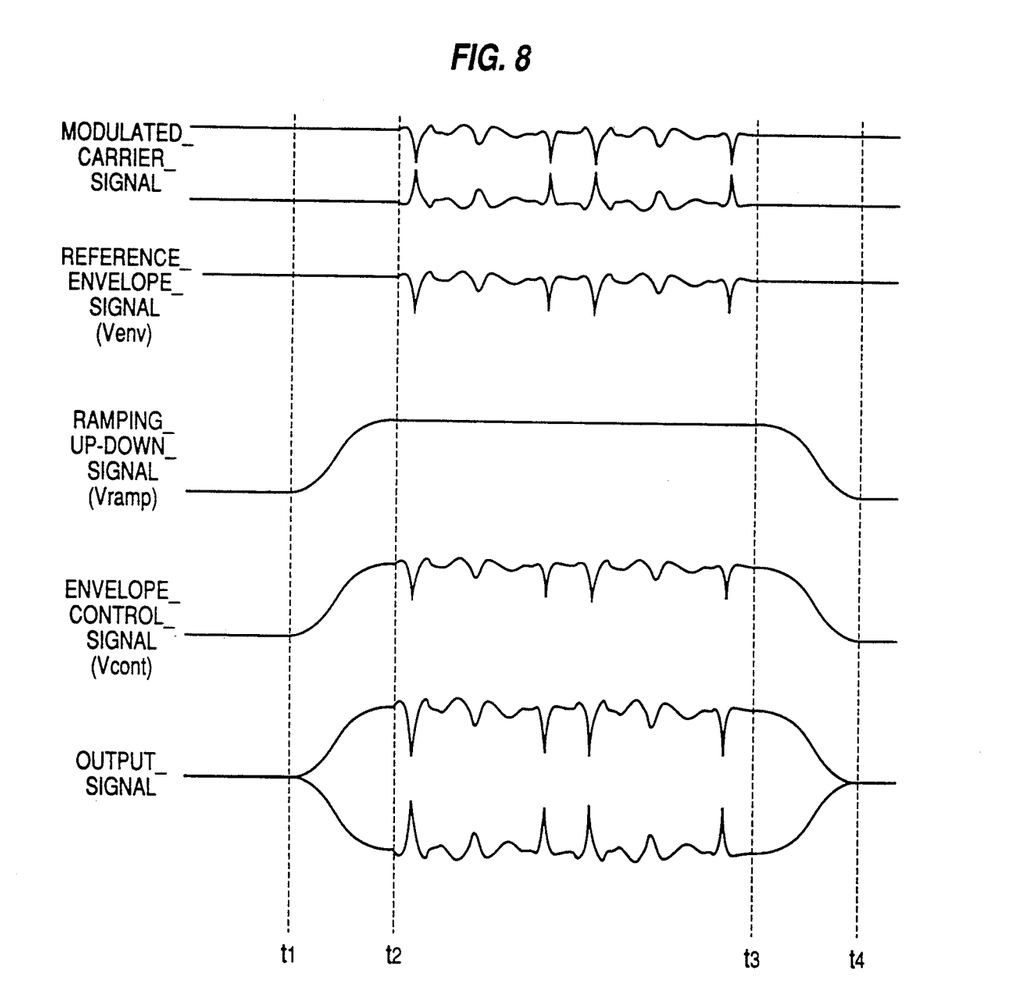
FIG. 8 is a timing chart of the transmitter shown in FIG. 7.

FIGS. 7 and 8 are a block diagram and a timing chart of the transmitter in accordance with another embodiment of the present invention.

In FIG. 7, element 1 is a modulation carrier signal input terminal; element 2 is a power amplifier having a gain control terminal 8 for amplifying the modulation carrier signal to obtain a transmission signal; element 3 is a monitor circuit for picking up a part of the transmission signal from the power amplifier 2 as a monitor signal; element 4 is a transmission signal output terminal; element 5 is an envelope detector connected to the monitor circuit 3 for detecting the envelope of the monitor signal to deliver a transmission envelope signal (Vdeta); element 60 is an envelope control signal generator for delivering an envelope control signal (Vcont), and element 7 is an error detector connected to the envelope detector 5 and envelope control signal generator 60 for comparing the transmission envelope signal Vdeta with the envelope control signal (Vcont) to generate an error signal and for supplying the error signal to the gain control terminal 8 for controlling the gain of the power amplifier 2. The envelope control signal generator 60 comprises: an envelope signal generator 61 for generating a distortion-free envelope signal (Venv) for the modulation carrier signal; a ramping signal generator 62 for generating a ramping up-down signal (Vramp); a multiplier 63 for multiplying Venv and (Vramp), and a detection compensation circuit 64 for receiving the output of the multiplier 63 and for compensating for the nonlinearity of the envelope detector 5. The output of the detection compensation circuit 64 is outputted as the envelope control signal (Vcont). The envelope signal generator 61 generates a distortion-free envelope signal (Venv=$\sqrt{I(t)^2+Q(t)^2}$) from orthogonal modulation base band signals (I(t), Q(t)).

The operation of the transmitter shown in FIG. 7 is explained with reference to the timing chart shown in FIG. 8.

In FIG. 8, the period t1–t2 is a transmission signal rise time, the period t2–t3 is a modulation data transmission time, and the period t3–t4 is a transmission signal fall time.

First, the operation before time t1 is explained. In this period, the ramping up-down signal (Vramp) is supposed to be 0 V. In the multiplier 63, Venv and Vramp(=0 V) are multiplied, and the output is 0 V. The power amplifier 2, monitor circuit 3, envelope detector 5, and error amplifier 7 compose a feedback loop, and the output transmission signal is controlled by the output Vcont(=0 V) of the envelope control signal generator 6.

Between t1 and t2, Vramp rises smoothly, and the output of the multiplier 63 goes up gradually, so that the transmission signal rises smoothly.

Between t2 and t3, the modulation carrier signal is a modulated signal, and from the envelope control signal generator 6, a distortion-free envelope signal for compensating the characteristic of the envelope detector 5 is delivered. The feedback loop is controlled by this distortion-free signal, and a distortion-free transmission signal is generated.

Between t3 and t4, by reverse sequence to that in t1–t2, the transmission signal falls gradually.

In this embodiment, too, the power amplifier 2 is required to be small in phase fluctuation near the saturation point where the operation is nonlinear, and also small in phase fluctuation against changes of the control voltage supplied to the gain control terminal 8. The method to satisfy this requirement is the same as that explained in the foregoing embodiment.

Figure 9:
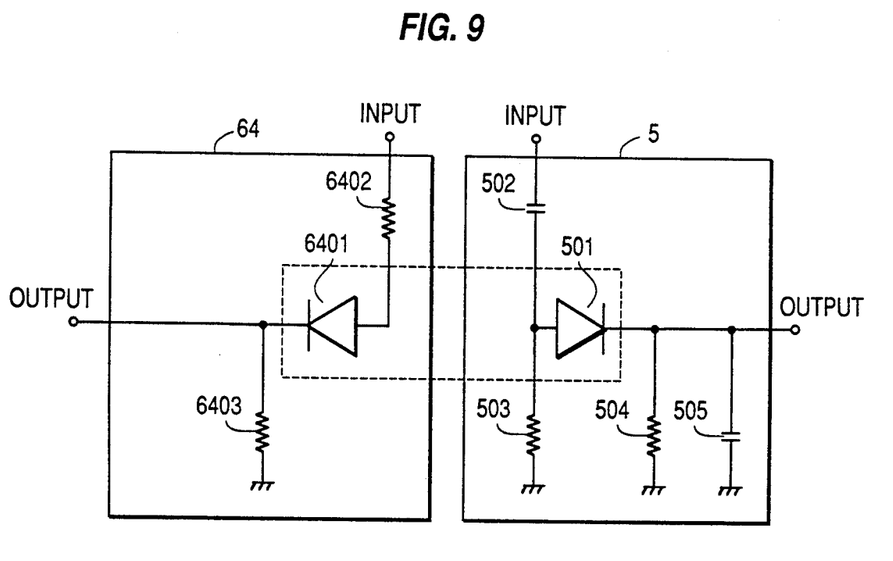
FIG. 9 is a block diagram showing an example of an envelope detector and a detector compensation circuit.

FIG. 9 shows an example of the envelope detector 5 and the detection compensation circuit 64.

In FIG. 9, element 501 is a detector diode; element 502 is a capacitor for bypassing the modulation carrier signal; element 503 is a bias resistor; element 504 is a load resistor; element 505 is a high frequency grounding capacitor; element 6401 is a diode for compensation of detection characteristic; element 6402 is a bias resistor, and element 6403 is a load resistor. The diode 6401 of the detection compensation circuit 64 is the same as the detector diode 501 used in the envelope detector 5, and the two diodes which are matched in characteristics are used. After the distortion-free envelope signal passes through the detection compensation circuit 64, the same nonlinearity as in the detector diode 501 occurs, and its output, the envelope control signal (Vcont), and the output of the envelope detector 5, the transmission envelope signal (Vdeta), have their nonlinearity mutually canceled in the error detector 7. Further, by disposing the detector diode 501 and diode 6401 on the same semiconductor chip, the characteristics of the two may be further matched, and changes of characteristics due to temperature may be canceled.

Thus, in the embodiment, using the power amplifier 2 of small phase fluctuation, by controlling the feedback loop with the distortion-free envelope control signal compensating for the nonlinearity of the envelope detector 5 which is the output of the envelope control signal generator 6, a distortion-free transmission output may be generated.

Furthermore, by multiplying Venv and Vramp in the multiplier 63, a burst transmission signal smooth in rise and fall is realized, and the unnecessary spread of the signal in the frequency region due to rising or falling characteristic of the burst transmission signal is reduced.

What is claimed is:

1. A transmitter comprising:
   a power amplifier having a gain control terminal for amplifying an input modulation carrier signal to obtain a transmission signal;
   a transmission monitor circuit for picking up a part of the transmission signal from the power amplifier as a monitor signal;
   a first detector for detecting an envelope of the monitor signal to obtain a transmission envelope signal;
   a linear amplifier having a gain control terminal for linearly amplifying the input modulation carrier signal;
   a second detector for detecting an envelope of the modulation carrier signal amplified by the linear amplifier to obtain a reference envelope signal;
   a second error detector for comparing the reference envelope signal with a reference voltage to generate a second error signal;
   a sample and hold circuit connected to the second error detector for sampling and holding the second error signal with an externally supplied sample and hold signal, and for supplying its output to the gain control terminal of the linear amplifier to control a gain of the linear amplifier; and
   a first error detector for comparing the reference envelope signal and the transmission envelope signal to generate a first error signal, and for supplying the first error signal to the gain control terminal of the power amplifier, thereby controlling a gain of the power amplifier.

2. A transmitter of claim 1, wherein the power amplifier possesses a small phase distortion characteristic.

3. A transmitter of claim 1, wherein the power amplifier comprises a transistor of emitter grounding or source grounding, a collector or a drain of the transistor being connected to the gain control terminal.

4. A transmitter of claim 1, wherein the power amplifier includes a preamplifier which comprises a source-grounded dual gate MOS FET, a second gate of the dual gate MOS FET being connected to the gain control terminal.

5. A transmitter of claim 1, wherein the first detector for generating the transmission envelope signal and the second detector for generating the reference envelope signal are identical circuits, and matched in characteristics.

6. A transmitter comprising:
   a power amplifier having a gain control terminal for amplifying an input modulation carrier signal to obtain a transmission signal;
   a transmission monitor circuit for picking up a part of the transmission signal from the power amplifier as a monitor signal;
   a first detector for detecting an envelope of the monitor signal to obtain a transmission envelope signal;
   a linear amplifier having a gain control terminal for linearly amplifying the input modulation carrier signal;
   a second detector for detecting an envelope of the modulation carrier signal amplified by the linear amplifier to obtain a reference envelope signal;
   a second error detector for comparing the reference envelope signal with a reference voltage to generate a second error signal;
   a sample and hold circuit connected to the second error detector for sampling and holding the second error signal with an externally supplied sample and hold signal, and for supplying its output to the gain control terminal of the linear amplifier to control a gain of the linear amplifier;
   an envelope control signal generator connected to the second detector for multiplying the reference envelope signal by an externally supplied burst control signal, and for delivering a burst-form reference envelope signal as an envelope control signal; and
   a first error detector for comparing the envelope control signal and the transmission envelope signal to generator a first error signal, and for supplying the first error signal to the gain control terminal of the power amplifier, thereby controlling a gain of the power amplifier.

7. A transmitter of claim 6, wherein the power amplifier possesses a small phase distortion characteristic.

8. A transmitter of claim 6, wherein the power amplifier comprises a transistor of emitter grounding or source grounding, a collector or a drain of the transistor being connected to the gain control terminal.

9. A transmitter of claim 6, wherein the power amplifier includes a preamplifier which comprises a source-grounded dual gate MOS FET, a second gate of the dual gate MOS FET being connected to the gain control terminal.

10. A transmitter of claim 6, wherein the first detector for generating the transmission envelope signal and the second detector for generating the reference envelope signal are identical circuits, and matched in characteristics.

11. A transmitter of claim 6, wherein the multiplier comprises a D/A converter and a lowpass filter, and the reference envelope signal is fed into a reference voltage terminal of the D/A converter, and is controlled by the burst control signal of digital signal.

12. A transmitter comprising:
   a power amplifier having a gain control terminal for amplifying an input modulation carrier signal to obtain a transmission signal;
   a transmission monitor circuit for picking up a part of the transmission signal from the power amplifier as a monitor signal;
   a detector for detecting an envelope of the monitor signal to obtain a transmission envelope signal;
   a distortion-free envelope signal generator for generating a distortion-free envelope signal;
   a burst control signal generator for generating a burst control signal;
   a multiplier for multiplying the distortion-free envelope signal and the burst control signal;
   a detection compensation circuit for receiving an output of the multiplier and compensating for non-linearity of the detector to deliver an envelope control signal; and
   an error detector for comparing the envelope control signal and the transmission envelope signal to generate an error signal, and for supplying the error signal to the gain control terminal of the power amplifier, thereby controlling a gain of the power amplifier.

13. A transmitter of claim 12, wherein the power amplifier possesses a small phase distortion characteristic.

14. A transmitter of claim 12, wherein the power amplifier comprises a transistor of emitter grounding or source grounding, a collector or a drain of the transistor being connected to the gain control terminal.

15. A transmitter of claim 12, wherein the power amplifier includes a preamplifier which comprises a source-grounded dual gate MOS FET, a second gate of the dual gate MOS FET being connected to the gain control terminal.

16. A transmitter of claim 12, wherein the detection compensation circuit is identical with the detector for generating the transmission envelope signal, and is composed by using a nonlinear element matched in characteristic.

* * * * *